United States Patent
Suga et al.

(10) Patent No.: US 11,348,758 B2
(45) Date of Patent: May 31, 2022

(54) CHARGED PARTICLE BEAM DEVICE

(71) Applicant: Hitachi High-Tech Corporation, Tokyo (JP)

(72) Inventors: Anoru Suga, Tokyo (JP); Shuhei Yabu, Tokyo (JP); Kazuki Ishizawa, Tokyo (JP); Michio Hatano, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/287,233

(22) PCT Filed: Feb. 5, 2019

(86) PCT No.: PCT/JP2019/004023
§ 371 (c)(1),
(2) Date: Apr. 21, 2021

(87) PCT Pub. No.: WO2020/161795
PCT Pub. Date: Aug. 13, 2020

(65) Prior Publication Data
US 2021/0391143 A1 Dec. 16, 2021

(51) Int. Cl.
*H01J 37/248* (2006.01)
*H01J 1/13* (2006.01)
(Continued)

(52) U.S. Cl.
CPC .............. *H01J 37/248* (2013.01); *H01J 1/13* (2013.01); *H01J 37/06* (2013.01); *H01J 37/242* (2013.01)

(58) Field of Classification Search
CPC .......... H01J 37/06; H01J 37/24; H01J 37/241; H01J 37/242; H01J 37/248; H01J 1/13
See application file for complete search history.

(56) References Cited

U.S. PATENT DOCUMENTS

| | | | | |
|---|---|---|---|---|
| 2008/0073556 | A1* | 3/2008 | Kawana | H01J 49/10 250/423 R |
| 2015/0355264 | A1* | 12/2015 | Overstreet | G01R 31/25 324/405 |

(Continued)

FOREIGN PATENT DOCUMENTS

| | | |
|---|---|---|
| JP | 5-166481 A | 7/1993 |
| JP | 2018-32561 A | 3/2018 |

OTHER PUBLICATIONS

International Search Report (PCT/ISA/210) issued in PCT Application No. PCT/JP2019/004023 dated Apr. 16, 2019 with English translation (two (2) pages).

(Continued)

*Primary Examiner* — David E Smith
(74) *Attorney, Agent, or Firm* — Crowell & Moring LLP

(57) ABSTRACT

An objective of the present invention is to provide a charged particle beam device capable of estimating a lifetime of a filament of a charged particle beam source with a cheap and simple circuit configuration. The charged particle beam device according to the present invention includes a boosting circuit that boosts a voltage to be supplied to a filament and estimates a remaining duration of the filament using a measured value of a current flowing on a low-voltage side of the boosting circuit (see FIG. 3).

11 Claims, 6 Drawing Sheets

(51) Int. Cl.
*H01J 37/06* (2006.01)
*H01J 37/24* (2006.01)

(56) References Cited

U.S. PATENT DOCUMENTS

2016/0238636 A1* 8/2016 Ito .................... H01J 37/304
2018/0063934 A1 3/2018 Obata et al.

OTHER PUBLICATIONS

Japanese-language Written Opinion (PCT/ISA/237) issued in PCT Application No. PCT/JP2019/004023 dated Apr. 16, 2019 (three (3) pages).

* cited by examiner

CHARGED PARTICLE BEAM DEVICE

TECHNICAL FIELD

The present invention relates to a charged particle beam device that radiates a charged particle beam to a sample.

BACKGROUND ART

A filament is used as a charged particle beam source of a charged particle beam device. For example, when charged particle beam source is electrons, a voltage is applied to both ends of the filament and a thermoelectron generated at the time of heating of the filament is used. An electron gun using this principle is called a thermoelectron gun. In this scheme, a filament is used at high temperature. Therefore, the filament is worn due to sublimation as the filament is used. When wear becomes intense, the filament is disconnected. A lifetime of the filament of the thermoelectron gun is known to be generally about 50 to 100 hours.

When a filament is disconnected and a user cannot observe an observation image of a sample suddenly or an emission current becomes 0 A, it is noticed that the filament is disconnected for the first time. When the filament is disconnected, it is necessary for the user to exchange the filament. Thus, since it is necessary to perform finding a viewing field of an observation sample, focus adjusting, and the like and perform imaging again, device use efficiency may deteriorate. If a lifetime of the filament can be estimated and a timing at which it is necessary to exchange the filament can be known in advance, the user can observe an observation image without worrying about the disconnection.

As a method of estimating a lifetime of a filament, there is a method of displaying an accumulated use time of a filament and estimating a lifetime of the filament from the experience until now. For this scheme, a longtime experience is necessary. Since a lifetime of the filament is changed depending on the magnitude of a voltage applied to both ends of a filament, it is difficult for a beginner to estimate the lifetime of the filament.

The following JP-A-H5-166481 (PTL 1) discloses a method of measuring ripples of a high-voltage power source and managing quality of a heating temperature of a filament from a value of the ripples. As a method of estimating a lifetime of the filament, there is a method of measuring a current flowing in a filament, obtaining an electrical resistant value of the filament from the measured current of the filament and a voltage applied to both ends of the filament, and investigating a worn state of the filament as the resistant value is changed over time.

CITATION LIST

Patent Literature

PTL 1: JP-A-H5-166481

SUMMARY OF INVENTION

Technical Problem

A charged particle beam device applies a high voltage of several tens of kilovolts to a filament. Accordingly, in order to estimate a lifetime of a filament by measuring a current of the filament, it is necessary to use floating measurement. In this case, a special circuit is necessary for the floating measurement. Accordingly, a circuit configuration of a voltage source becomes complicated, which results in an increase in the size and an increase in cost. When a current of a filament is measured by measuring a voltage applied to the filament, a voltage of several tens of kilovolts is measured. However, when this voltage is applied to an AD converter, a resolution of the AD converter is insufficient. Accordingly, it is difficult to directly measure a voltage of the filament of several tens of kilovolts.

The present invention has been devised in view of the foregoing problems and an objective of the present invention is to provide a charged particle beam device capable of estimating a lifetime of a filament of a charged particle beam source with a cheap and simple circuit configuration.

Solution to Problem

According to an aspect of the present invention, a charged particle beam device includes a boosting circuit configured to boost a voltage to be supplied to a filament and estimates a remaining duration of the filament using a measured value of a current flowing on a low-voltage side of the boosting circuit.

Advantageous Effects of Invention

According to the aspect of the present invention, the charged particle beam device can accurately estimate a lifetime of a filament with a cheap and simple circuit configuration. Thus, since a timing at which the filament is exchanged before disconnection can be known, it is possible to reduce a risk of disconnecting the filament during observation.

DESCRIPTION OF EMBODIMENTS

First Embodiment

Figure 1:
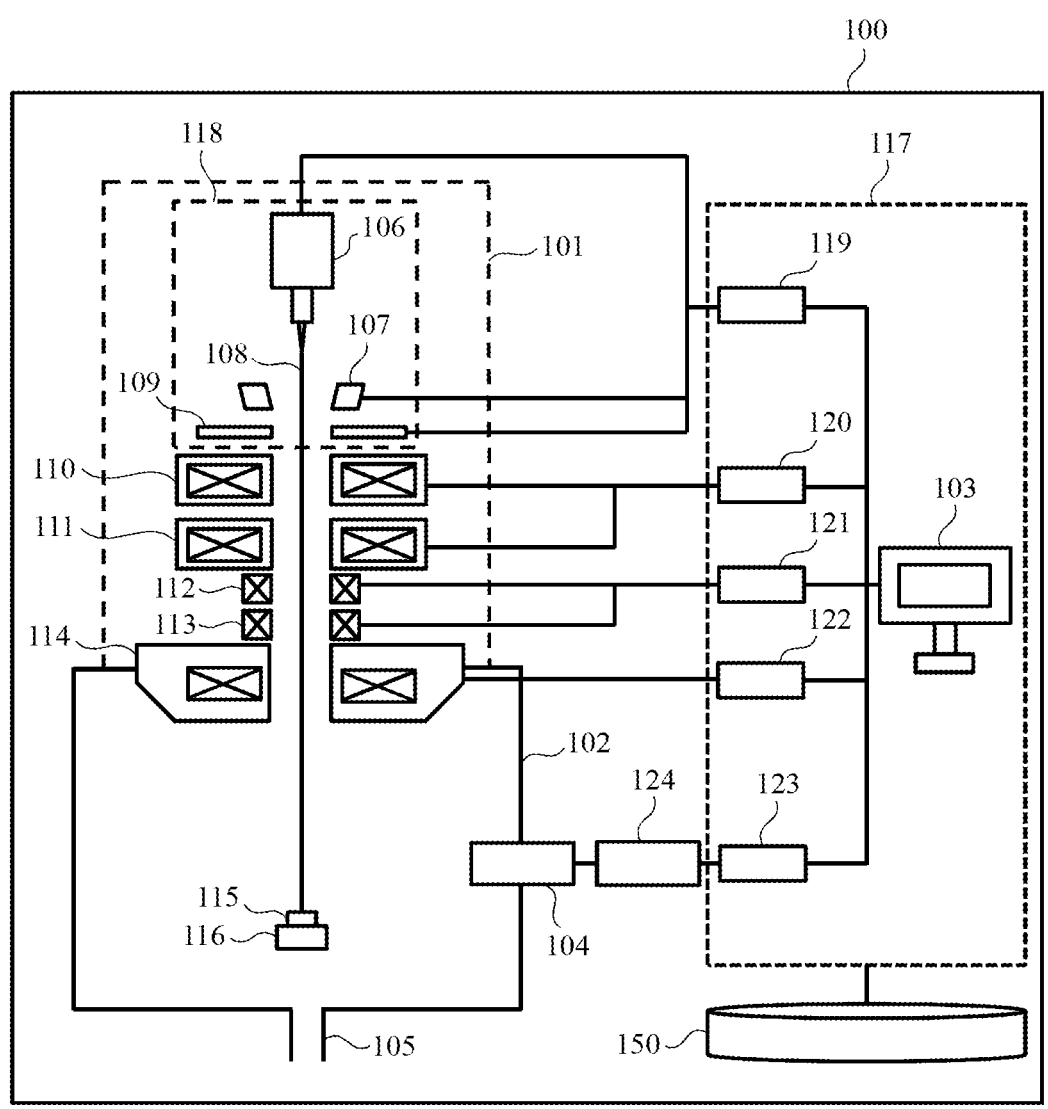
FIG. 1 is a diagram illustrating a configuration of a scanning electron microscope 100 according to a first embodiment.

FIG. 1 is a diagram illustrating a configuration of a scanning electron microscope 100 according to a first embodiment of the present invention. The scanning electron microscope 100 includes a barrel unit 101, a sample chamber 102, and a control unit 117. The barrel unit 101 includes a cathode 106, a Wehnelt 107, an anode 109, a first focusing lens 110, a second focusing lens 111, an upper deflection coil 112, a lower deflection coil 113, and an objective lens 114. The sample chamber 102 is maintained to the degree of vacuum of $10^{-3}$ to $10^{-4}$ Pa by a vacuum pump 105. The sample chamber 102 includes a sample 115, a sample stage 116, and a detector 104.

The control unit 117 is a functional unit that controls each unit of the scanning electron microscope 100 and includes a high-voltage control circuit 119, a focusing lens control circuit 120, a deflection control circuit 121, an objective lens control circuit 122, a signal processing circuit 123, and a display device 103. The high-voltage control circuit 119 controls a voltage to be applied to an electron gun 118. The focusing lens control circuit 120 controls the first focusing lens 110 and the second focusing lens 111. The deflection control circuit 121 controls the upper deflection coil 112 and the lower deflection coil 113. The objective lens control circuit 122 controls the objective lens 114. The storage unit 150 can be configured by, for example, a storage device such as a hard disk.

A primary electron beam 108 is focused by the first focusing lens 110 and the second focusing lens 111, and subsequently is focused on the sample 115 by the objective lens 114. The primary electron beam 108 focused on the sample 115 is, at the same time, scanned at a radiation position on the sample 115 by the upper deflection coil 112 and the lower deflection coil 113. As the primary electron beam 108 is radiated, signal electrons decided by the shape, composition, and the like of the sample 115 are emitted from the sample 115. The detector 104 detects the signal electrons. The detected signal electrons are amplified by an amplifier 124. The signal processing circuit 123 generates an observation image of the sample 115 using a detection result of the signal electrons and the display device 103 displays the observation image.

Figure 2:
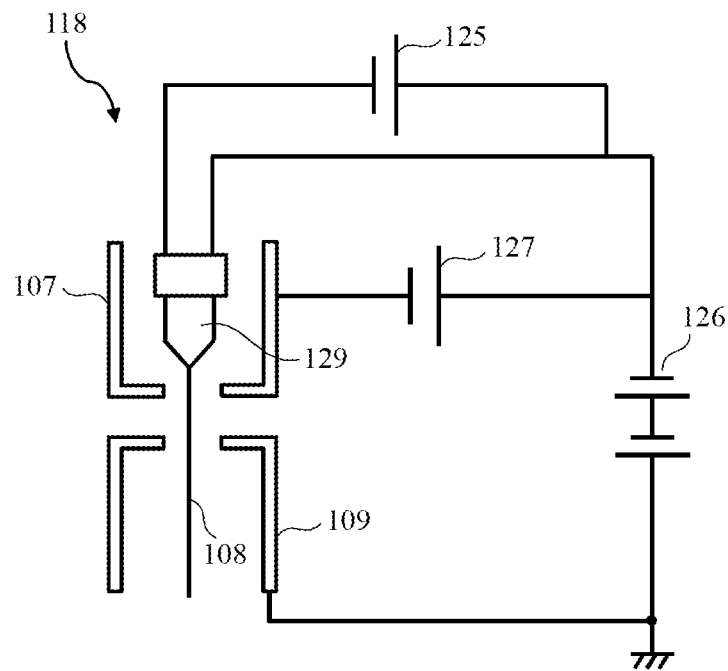
FIG. 2 is a diagram illustrating a configuration of an electron gun 118.

FIG. 2 is a diagram illustrating a configuration of the electron gun 118. As the electron gun 118, a thermoelectron gun, a Schotty-emission electron gun, a cold cathode field emission electron source, or the like can be used. In the first embodiment, a thermoelectron gun is adopted. When a current is caused to flow to a filament 129 of the cathode 106, and a voltage is applied to both ends of the filament 129 to heat the filament 129, the primary electron beam 108 is radiated toward the anode 109.

The electron gun 118 further includes a heating power source 125, a bias power source 126, and an acceleration power source 127. The heating power source 125 supplies heat serving as a thermoelectron gun. The acceleration power source 127 supplies an acceleration voltage of the primary electron beam 108. The bias power source 126 controls a beam current of the primary electron beam 108. The high-voltage control circuit 119 controls the electron gun 118 by controlling operations of these power sources.

Figure 3:
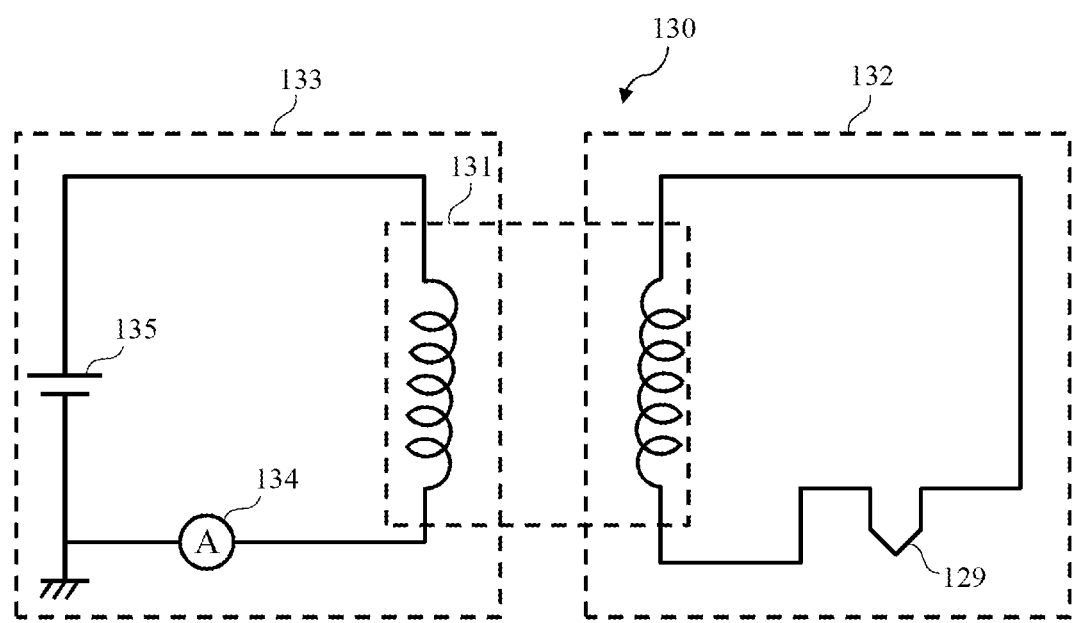
FIG. 3 is a circuit diagram illustrating a boosting circuit 130 that supplies a current to a filament 129.

FIG. 3 is a circuit diagram illustrating the boosting circuit 130 that supplies a current to the filament 129. The boosting circuit 130 can be configured as a part of the electron gun 118 or can be connected to the electron gun 118. FIG. 3 illustrates an example in which the boosting circuit 130 is configured as a circuit different from the electron gun 118 to facilitate description. The boosting circuit 130 can be disposed at any location inside the scanning electron microscope 100.

The boosting circuit 130 includes a low-voltage side 133 and a high-voltage side 132. The low-voltage side 133 includes a voltage source 135 and the filament 129 is connected to the high-voltage side 132. A voltage supplied by the voltage source 135 is boosted by a transformer 131 and supplied to the high-voltage side 132. In this way, the current can be supplied to the filament 129. An ammeter 134 measures a current flowing in the low-voltage side 133. In FIG. 3, a circuit that applies a high voltage is omitted to facilitate description.

To accurately measure a current flowing in the filament 129, it is preferable to install the ammeter 134 on the high-voltage side 132. However, it is necessary to inhibit circuit breakdown or the like due to a high voltage. Therefore, when the ammeter 134 is disposed on the high-voltage side 132, it is necessary to use floating measurement. Then, the size of a circuit that measures a current increases, which results in an increase in the size of the boosting circuit 130 or an increase in cost. On one hand, when a current is measured on the low-voltage side 133 as in FIG. 3, it is necessary to convert a current value measured on the low-voltage side 133 into a current value flowing on the high-voltage side 132 in consideration of characteristics of the transformer 131 in order to know a current value flowing in the filament 129. On the other hand, a special circuit configuration for floating measurement or the like is unnecessary. Thus, there is the advantage in which a current of the filament can be measured with a cheap and small circuit configuration.

First Embodiment: Method of Estimating Lifetime of Filament

A method of estimating a lifetime of the filament 129 using a current value flowing in the low-voltage side 133 will be described. Since the filament 129 in the electron gun 118 is heated to a high temperature and used, the filament 129 sublimates for use and a wire diameter becomes thin. Thus, a resistant value of the filament 129 increases. Therefore, by measuring the resistant value of the filament 129, it is possible to estimate how much the wire diameter of the filament 129 becomes thin. Since the wire diameter of the filament 129 indicates a lifetime of the filament 129, the lifetime of the filament 129 can be estimated in accordance with the foregoing scheme.

Figure 4:
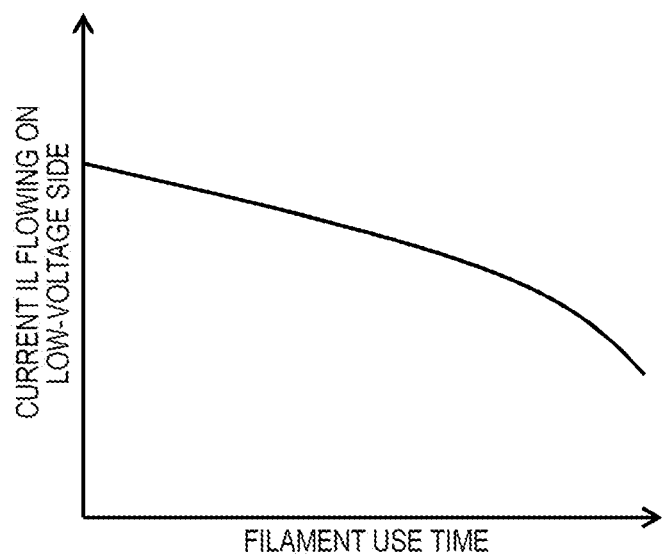
FIG. 4 is a graph illustrating a relation between an accumulated use time of the filament 129 and a current flowing in a low-voltage side 133.
Figure 4:
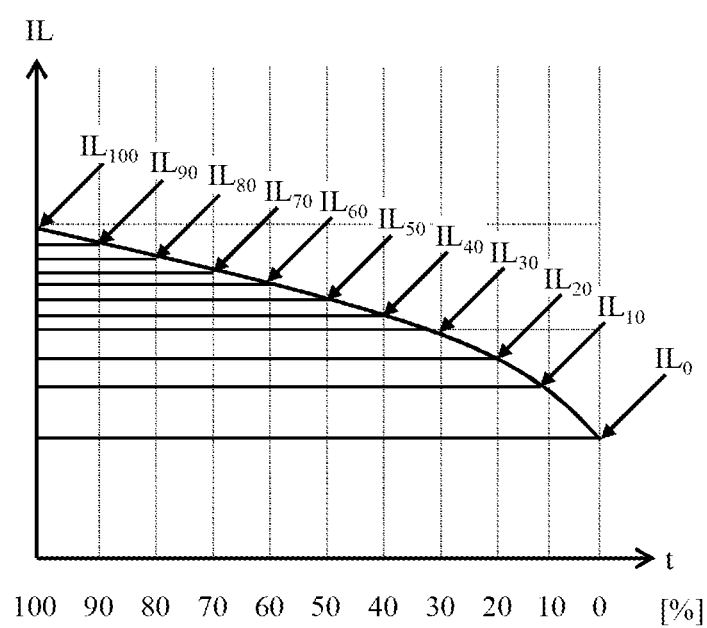

FIG. 4 is a graph illustrating a relation between an accumulated use time of the filament 129 and a current flowing in the low-voltage side 133. In order to measure an electrical resistant value of the filament 129, measurement of a current flowing in the filament 129 is the most direct method. However, in the first embodiment, it is assumed that a current flowing on the low-voltage side 133 is measured instead of this. In the first embodiment, a relation between an accumulated use time of the filament 129 and a current flowing on the low-voltage side 133 is measured in advance, is described as data illustrated in FIG. 4, and is stored in the storage unit 150. It is considered that the current flowing in the low-voltage side 133 decreases as the use time of the filament 129 passes, and a current flowing in the filament 129 is reflected to some extent. The control unit 117 can estimate the lifetime of the filament 129 by acquiring a current value measured by the ammeter 134 and comparing the data of FIG. 4 using the current value.

The lower part of FIG. 4 illustrates an example of a case in which a remaining lifetime of the filament 129 is partitioned into 10 pieces and is displayed by percentage. By specifying the current of the filament corresponding to each remaining lifetime in advance and comparing the current with a measurement result by the ammeter 134, it is possible to display the remaining lifetime of the filament 129 by percentage. By presenting the result on, for example, the display device 103, it is possible to inform the user of the remaining lifetime.

First Embodiment: Conclusion

The scanning electron microscope 100 according to the first embodiment includes the boosting circuit 130 that boosts a voltage to be supplied to the filament 129 and estimates a remaining lifetime of the filament 129 using a measured value of a current flowing on the low-voltage side 133. Thus, since a special circuit configuration for directly measuring a current of the filament is unnecessary, it is possible to estimate the remaining lifetime of the filament 129 with a simple circuit configuration.

Second Embodiment

In the first embodiment, the scheme of estimating the lifetime of the filament 129 using a current flowing on the low-voltage side 133 has been described. In this scheme, it is supposed that a voltage applied to the filament 129 is constant and the relation described in FIG. 4 is not changed. However, the actual scanning electron microscope 100 is used while changing a voltage applied to the filament 129 in some cases.

When the voltage applied to the filament 129 is changed, a heating temperature of the filament 129 is changed. Therefore, characteristics of the resistant value may also be changed over time. Thus, the relation described in FIG. 4 cannot be used as it is. Accordingly, in a second embodiment, a scheme of estimating a lifetime of the filament 129 by using the relation described in FIG. 4 in a case in which a voltage applied to the filament 129 is changed will be described. A configuration of the scanning electron microscope 100 is similar to that of the first embodiment.

Figure 5A:
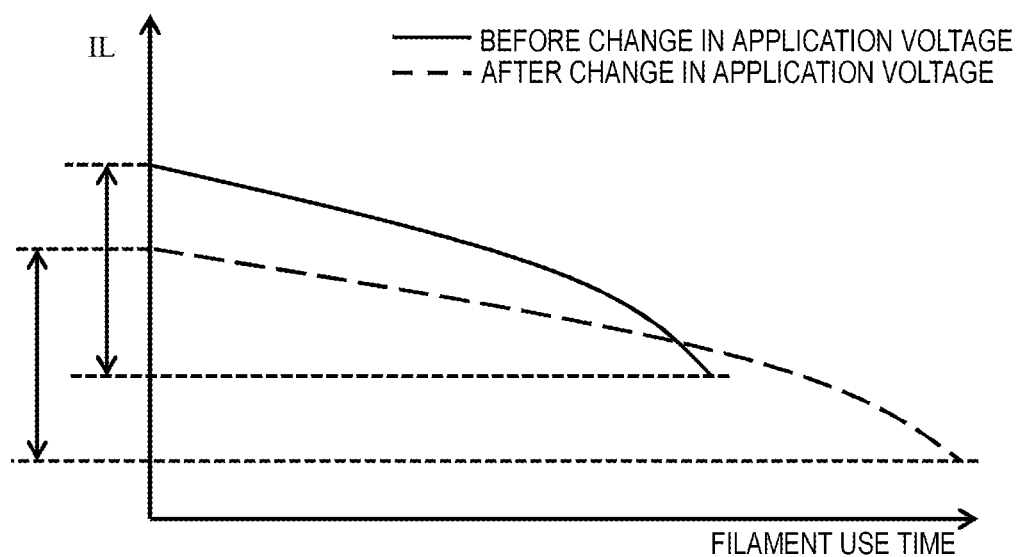
FIG. 5A is a diagram illustrating a relation between a current flowing in the low-voltage side 133 and a filament use time before and after a change in an application voltage to the filament 129.

FIG. 5A is a diagram illustrating a relation between a current flowing in the low-voltage side 133 and a filament use time before and after an application voltage to the filament 129 is changed. For example, when an application voltage is lowered, a current flowing in the filament 129 attenuates. Therefore, a lifetime of the filament 129 increases. Accordingly, the relation described in FIG. 4 is changed as the dotted line of FIG. 5A is indicated. A relation indicated by a dotted line in FIG. 5A is not known if the relation is not measured in advance. Here, in consideration of characteristics in which the filament 129 becomes thin as a use time passes, a difference in a current flowing in the low-voltage side 133 between use start and end of the lifetime is assumed to be unchanged before and after a change in the application voltage (see arrows of FIG. 5A). In the second embodiment, the lifetime of the filament 129 is estimated using this principle.

Figure 5B:
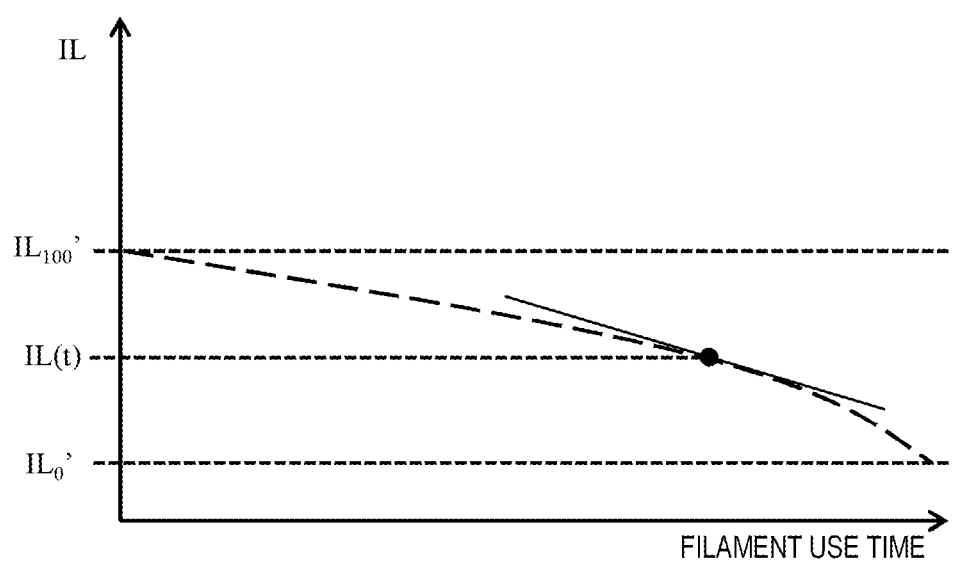
FIG. 5B is a schematic diagram illustrating an order in which a lifetime of the filament 129 is estimated.

FIG. 5B is a schematic diagram illustrating an order in which a lifetime of the filament 129 is estimated. To facilitate description, only the dotted line in FIG. 5A is copied. At an appropriate time point after an application voltage to the filament 129 is changed (for example, a changed time point), a time derivative ($\Delta IL/\Delta t$) of a current flowing in the low-voltage side 133 is obtained. When the current of the low-voltage side 133 is assumed to linearly decrease as an accumulated use time passes, a remaining time until the end point time of the lifetime can be calculated by dividing a difference between a current value IL(t) of the current of the low-voltage side 133 and a current value $IL_0'$ at the end point time of the lifetime by the obtained time derivative. That is, the remaining time=$(IL(t)-IL_0')/(\Delta IL/\Delta t)$ (Expression 1) is satisfied.

Figure 5C:
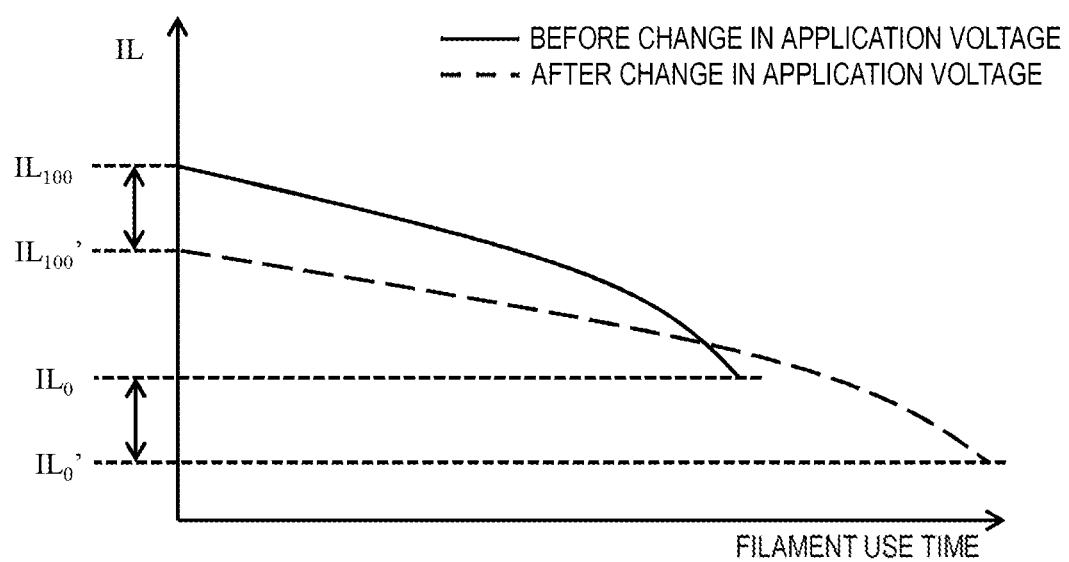
FIG. 5C is a diagram illustrating a difference in a current flowing in the low-voltage side 133 at the time of use start before and after an application voltage to the filament 129 is changed.

FIG. 5C is a diagram illustrating a difference in a current flowing in the low-voltage side 133 at the time of use start before and after a change in an application voltage to the filament 129. $IL_{100}$ is a current flowing on the low-voltage side 133 at the time of use start before the change in the application voltage and $IL_{100}'$ is a current flowing on the low-voltage side 133 at the time of use start after the change in the application voltage. When it is assumed that the application voltage to the filament 129 and the current flowing in the filament 129 have a linear relation in which an electrical resistance of the filament 129 is a reference, a difference in the current flowing in the filament 129 before and after the change in the application voltage can be calculated in accordance with the electrical resistance and the linear relation. Accordingly, the current flowing on the low-voltage side 133 can also be calculated based on the electrical resistance and the linear relation. That is, a difference between $IL_{100}$ and $IL_{100}'$ can be calculated. This difference is also equal to a difference between $IL_0$ and $IL_0'$ at the time of end.

When DIFF0 is the difference between $IL_0$ and $IL_0'$ (that is, the difference between $IL_{100}$ and $IL_{100}'$), $IL(t)-IL_0'=IL(t)-(IL_0-DIFF0)$ (Expression 2) can be calculated. By substituting Expression 2 into Expression 1, it is possible to calculate a remaining lifetime of the filament 129.

FIGS. 5A to 5C illustrate examples in which the application voltage to the filament 129 is lowered. However, when the application voltage is raised, $IL_{100}'$ is greater than $IL_{100}$ and $IL_0'$ is also greater than $IL_0$. Accordingly, it is added that Expression 2 which is $IL(t)-IL_0'=IL(t)-(DIFF0-IL_0)$ is satisfied.

In particular, when the current of the low-voltage side 133 is considered to decrease nonlinearly near the end time of the lifetime as the accumulated use time passes, values obtained by Expressions 1 and 2 may be appropriately corrected. For example, since the relation illustrated in FIG. 4 is known in advance, a relation before and after the change in the application voltage can be obtained approximately by extending the relation in the direction of the horizontal axis (a time direction). The remaining lifetime may be calculated using this approximate relation.

Second Embodiment: Conclusion

The scanning electron microscope 100 according to the second embodiment calculates a remaining time reaching the end point time of the lifetime using the time derivative of the current flowing on the low-voltage side 133 in accordance with the relation described in Expression 1 when the application voltage to the filament 129 is changed. Thus, even when the relation illustrated in FIG. 4 is changed, the lifetime of the filament 129 can be obtained accurately.

The scanning electron microscope 100 according to the second embodiment obtains a difference in the current of the low-voltage side 133 before and after the change in the application voltage based on the linear relation of the application voltage to the filament 129 and the current flowing in the filament 129 in accordance with the electrical resistance of the filament 129 when the application voltage to the filament 129 is changed. Thus, in accordance with the relation described in Expression 2, it is possible to obtain the current at the time of use start and the current at the end time of the lifetime after the change in the application voltage. That is, even when the relation between the current of the low-voltage side 133 and the accumulated use time after the change in the application voltage is not measured in advance, the relation can be estimated by the calculation.

Third Embodiment

Figure 6:
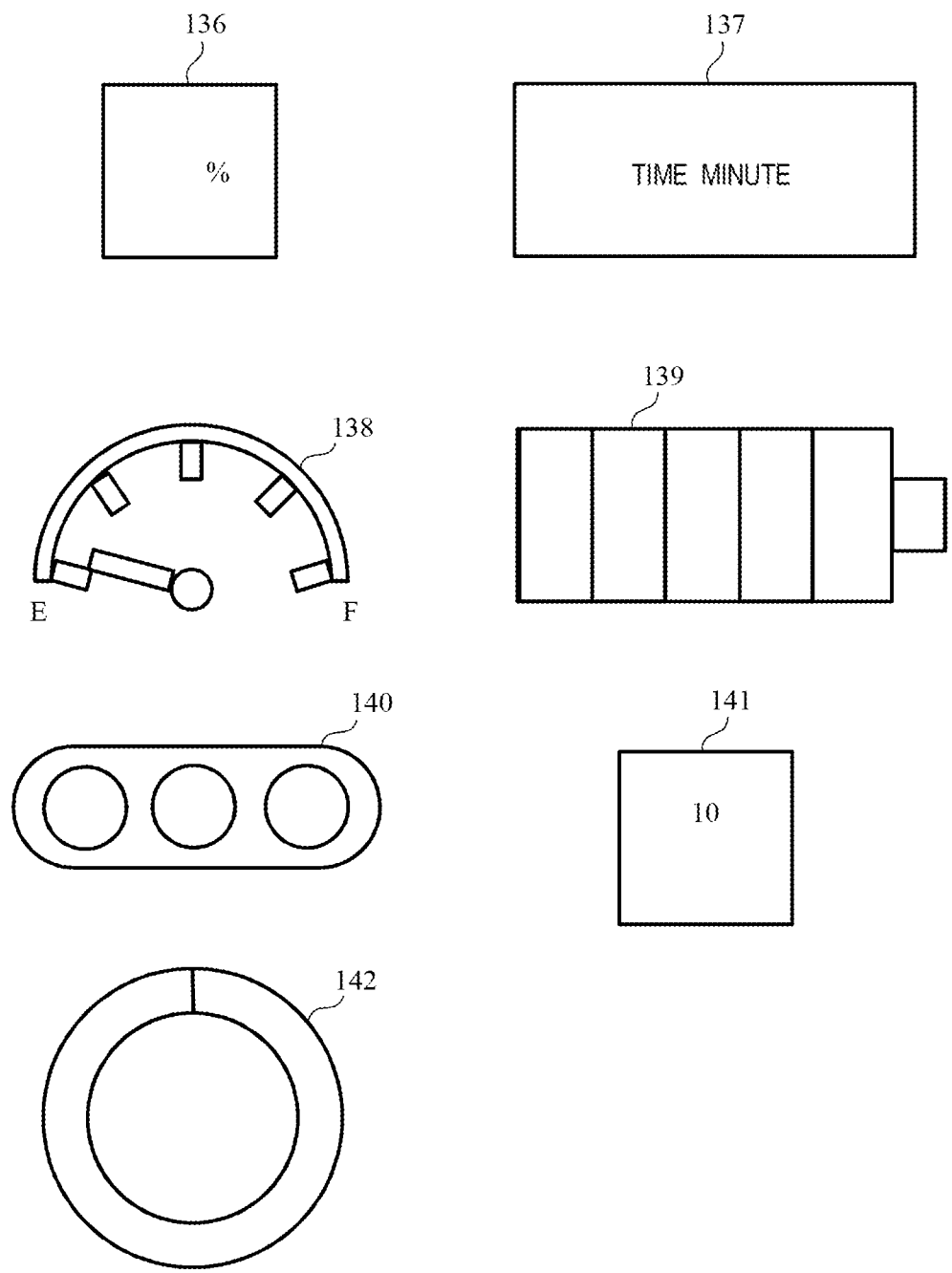
FIG. 6 is a diagram illustrating examples of icon indications representing a lifetime of the filament 129 on a display device 103.

FIG. 6 is a diagram illustrating examples of icon indications representing a lifetime of the filament 129 on the display device 103. In the first embodiment, the method of estimating the lifetime of the filament 129 has been described. As a method of informing a user of a current lifetime of the filament 129, the lifetime can be suggested using an appropriate icon or the like on the display device 103. For example, a percentage indication 136, a time display 137, a meter indication 138, a battery indication 139, a signal indication 140, a count indication 141, an LED lamp indication 142, and the like can be used so that even a beginner can easily ascertain the lifetime visually. Due to these indications, it is easy for the user to know an exchange time of the filament 129.

The indications illustrated in FIG. 6 can be provided as graphical user interfaces (GUIs) displayed on the display device 103 and can also be provided on a display device of the body of the scanning electron microscope 100. For example, the LED lamp indication 142 can be provided by installing an LED lamp on the body of the scanning electron microscope 100. The same applies to other aspects.

Instead of or in addition to the indications of FIG. 6, a message for prompting exchange of the filament 129 may be presented. For example, when the remaining lifetime is equal to or less than a predetermined threshold, a message for notifying that the remaining lifetime is equal to or less than the predetermined threshold can be presented.

Modification Examples of the Present Invention

In the foregoing embodiments, the current flowing in the low-voltage side 133 is measured by the ammeter 134 and the lifetime of the filament 129 is estimated using the current, as described above. Instead of this, a voltage applied to the low-voltage side 133 can be used. That is, a relation between the voltage applied to the low-voltage side 133 and a total usable time of the filament 129 is measured in advance as in FIG. 4 and data describing the relation is stored in the storage unit 150. The control unit 117 may acquire the voltage of the low-voltage side 133 and refer to the data by the voltage. The same applies to the scheme described in the second embodiment.

In the foregoing embodiments, the lifetime of the filament 129 is estimated using the current flowing on the low-voltage side 133, as described above. However, instead of or in parallel with this, the accumulated use time of the filament 129 can also be used. For example, the lifetime can be estimated by recording the total usable time of the filament 129 under a standard application voltage in advance in the storage unit 150 and accumulating and comparing a time of conduction in the filament 129 with the total usable time. When the current flowing in the low-voltage side 133 is used together, for example, results estimated using two schemes can each be presented on the display device 103 and a user can be trusted to use any of the results.

In the foregoing embodiments, the configuration in which the transformer 131 is used as the boosting circuit 130 has been exemplified. However, if the voltage of the low-voltage side 133 can be boosted to the voltage of the high-voltage side 132, any configuration of the boosting circuit 130 can be used. That is, it is enough that the current flowing on the low-voltage side 133 may be able to be measured.

In the foregoing embodiments, the control unit 117 can be configured by hardware such as a circuit device on which the function of the control unit 117 is mounted and can also be configured by causing a computation device to execute software on which the function is mounted.

In the foregoing embodiments, the scanning electron microscope 100 has been exemplified, but the present invention can be applied to another type of charged particle beam device. That is, the charged particle beam device in which the filament 129 is used as a charged particle beam source can estimate a lifetime of the filament 129 according to the present invention.

REFERENCE SIGNS LIST

100: scanning electron microscope
101: barrel unit
102: sample chamber
103: display device
104: detector
105: vacuum pump
106: cathode
107: Wehnelt
108: electron beam
109: anode
110: first focusing lens
111: second focusing lens
112: upper deflection coil
113: lower deflection coil
114: objective lens
115: sample
116: sample stage
117: control unit
118: electron gun
119: high-voltage control circuit
120: focusing lens control circuit
121: deflection control circuit
122: objective lens control circuit
123: signal processing circuit
124: amplifier
129: filament

The invention claimed is:

1. A charged particle beam device that radiates a charged particle beam to a sample, the device comprising:
a charged particle beam source configured to radiate the charged particle beam from a filament;
a boosting circuit configured to boost a voltage to be supplied to the filament; and
a control unit configured to estimate a remaining duration in which the filament is normally usable,
wherein the boosting circuit includes a low-voltage side circuit in which a first current flows and a high-voltage side circuit in which a second current flows,
wherein the boosting circuit boosts a first voltage applied to the low-voltage side circuit to a second voltage applied to the high-voltage side circuit and applies the second voltage to the filament, and
wherein the control unit estimates the remaining duration using a measured value of the first current or a measured value of the first voltage.

2. The charged particle beam device according to claim 1, further comprising:
a storage unit configured to store data that describes a correspondence relation between a total usable time in which the filament is normally usable and the first current or the first voltage in conduction of the filament,
wherein the control unit estimates the remaining duration by referring to the data using the measured value of the first current or the measured value of the first voltage.

3. The charged particle beam device according to claim 2, wherein, when the boosting circuit changes the voltage to be supplied to the filament, the control unit estimates the remaining duration by calculating a time until an end point time of a total usable time using a time derivative of the first current or a time derivative of the first voltage instead of referring to the data using the measured value of the first current or the measured value of the first voltage.

4. The charged particle beam device according to claim 3,
wherein the data describes a value of the first current at a time point at which use of the filament is started and a value of the first current at the end point time of the total usable time,
wherein the control unit calculates the time derivative of the first current and acquires a measured value of the first current at a time point of the calculation, and
wherein the control unit estimates the remaining duration by dividing a difference between the measured value of the first current at the time point of the calculation and an expected value of the first current at the end point time after a change in the voltage supplied to the filament by the time derivative of the first current.

5. The charged particle beam device according to claim 3,
wherein the data describes a value of the first voltage at a time point at which use of the filament is started and a value of the first voltage at the end point time of the total usable time,
wherein the control unit calculates the time derivative of the first voltage and acquires a measured value of the first voltage at a time point of the calculation, and
wherein the control unit estimates the remaining duration by dividing a difference between the measured value of the first voltage at the time point of the calculation and an expected value of the first voltage at the end point time after a change in the voltage supplied to the filament by the time derivative of the first voltage.

6. The charged particle beam device according to claim 4, wherein the control unit calculates the expected value of the first current at the end point time after the change in the voltage supplied to the filament in accordance with an electrical resistant value of the filament.

7. The charged particle beam device according to claim 5, wherein the control unit calculates the expected value of the first voltage at the end point time after the change in the voltage supplied to the filament in accordance with an electrical resistance value of the filament.

8. The charged particle beam device according to claim 1, further comprising an interface configured to present the remaining duration.

9. The charged particle beam device according to claim 8, wherein the interface is configured by a display device included in the charged particle beam device.

10. The charged particle beam device according to claim 8, further comprising:
a graphical user interface (GUI) used for a user to operate the charged particle beam device,
wherein the interface is configured by an image displayed by the GUI.

11. The charged particle beam device according to claim 10, wherein the GUI displays a message for prompting exchange of the filament.

* * * * *